(12) United States Patent
Lee et al.

(10) Patent No.: US 10,643,858 B2
(45) Date of Patent: May 5, 2020

(54) METHOD OF ETCHING SUBSTRATE

(71) Applicant: SAMSUNG ELECTRONICS CO., LTD., Suwon-si, Gyeonggi-Do (KR)

(72) Inventors: Eunwoo Lee, Seongnam-si (KR); Sangrok Oh, Yongin-si (KR); Jungmo Sung, Gyeongg-Do (KR); Jongwoo Sun, Hwaseong-si (KR)

(73) Assignee: Samsung Electronics Co., Ltd., Suwon-si, Gyeonggi-Do (KR)

( * ) Notice: Subject to any disclaimer, the term of this patent is extended or adjusted under 35 U.S.C. 154(b) by 69 days.

(21) Appl. No.: 16/058,981

(22) Filed: Aug. 8, 2018

(65) Prior Publication Data
US 2019/0109010 A1    Apr. 11, 2019

(30) Foreign Application Priority Data

Oct. 11, 2017  (KR) .................. 10-2017-0131509
Jan. 26, 2018  (KR) .................. 10-2018-0010176

(51) Int. Cl.
| | |
|---|---|
| *H01L 21/308* | (2006.01) |
| *H01L 21/033* | (2006.01) |
| *H01L 21/027* | (2006.01) |
| *H01L 21/3105* | (2006.01) |

(52) U.S. Cl.
CPC ...... *H01L 21/3086* (2013.01); *H01L 21/0274* (2013.01); *H01L 21/0337* (2013.01); *H01L 21/3081* (2013.01); *H01L 21/3105* (2013.01)

(58) Field of Classification Search
None
See application file for complete search history.

(56) References Cited

U.S. PATENT DOCUMENTS

| 5,766,999 | A   | 6/1998  | Sato                        |
|-----------|-----|---------|-----------------------------|
| 6,576,562 | B2* | 6/2003  | Ohuchi ........ H01L 21/0271 |
|           |     |         | 257/E21.024                 |
| 6,617,253 | B1  | 9/2003  | Chu et al.                  |
| 6,677,247 | B2  | 1/2004  | Yuan et al.                 |
| 6,815,333 | B2  | 11/2004 | Townsend, III et al.        |
| 6,911,399 | B2  | 6/2005  | Liu et al.                  |
| 7,018,678 | B2  | 3/2006  | Gronbeck et al.             |
| 7,049,052 | B2  | 5/2006  | Xiao et al.                 |
| 7,276,447 | B1  | 10/2007 | Delgadino et al.            |
| 7,301,107 | B2  | 11/2007 | Karthikeyan et al.          |
| 7,393,788 | B2  | 7/2008  | Cook                        |

(Continued)

FOREIGN PATENT DOCUMENTS

| JP | 3435897 B2   | 8/2003 |
|----|--------------|--------|
| KR | 100124527 B1 | 9/1997 |

(Continued)

*Primary Examiner* — Andres Munoz
(74) *Attorney, Agent, or Firm* — Volentine, Whitt & Francos, PLLC

(57) ABSTRACT

A method of forming patterns of a semiconductor device includes forming a photoresist pattern, which contains a first carbon compound, on a substrate, reforming a top surface of the photoresist pattern to form an upper mask layer which contains a second carbon compound, different from the first carbon compound, on the photoresist pattern, and etching a portion of the substrate using the upper mask layer and the photoresist pattern as an etch mask.

19 Claims, 14 Drawing Sheets

(56) References Cited

U.S. PATENT DOCUMENTS

| | | | |
|---|---|---|---|
| 7,556,970 B2 * | 7/2009 | Hori | H01L 21/3105 257/E21.191 |
| 7,871,926 B2 | 1/2011 | Xia et al. | |
| 8,073,667 B2 | 12/2011 | Strang et al. | |
| 8,394,720 B2 | 3/2013 | Fujihara | |
| 8,906,810 B2 | 12/2014 | Indrakanti et al. | |
| 9,209,033 B2 | 12/2015 | Fernandez et al. | |
| 9,287,179 B2 | 3/2016 | Huang et al. | |
| 9,318,343 B2 | 4/2016 | Ranjan et al. | |
| 9,320,387 B2 | 4/2016 | Reddy et al. | |
| 9,356,058 B2 | 5/2016 | Chuang et al. | |
| 9,520,296 B2 | 12/2016 | Chen et al. | |
| 9,589,799 B2 | 3/2017 | Reddy et al. | |
| 9,595,531 B2 | 3/2017 | Zhu et al. | |
| 9,633,846 B2 | 4/2017 | Paterson et al. | |
| 9,685,332 B2 | 6/2017 | Chen et al. | |
| 9,735,027 B2 | 8/2017 | Lee et al. | |
| 9,735,069 B2 | 8/2017 | Kabouzi et al. | |
| 9,824,896 B2 | 11/2017 | Tan et al. | |
| 2002/0064958 A1 * | 5/2002 | Takeuchi | G03F 7/094 438/695 |
| 2002/0081499 A1 * | 6/2002 | Zampini | G03F 7/0392 430/5 |
| 2007/0284337 A1 * | 12/2007 | Mochizuki | H01L 21/76816 216/67 |
| 2009/0191711 A1 * | 7/2009 | Rui | G03F 7/40 438/695 |
| 2013/0084707 A1 | 4/2013 | Hashimoto et al. | |
| 2016/0133640 A1 | 5/2016 | Zhu et al. | |
| 2017/0140921 A1 | 5/2017 | Khusnatdinov et al. | |

FOREIGN PATENT DOCUMENTS

| | | |
|---|---|---|
| KR | 19980005799 A | 3/1998 |
| KR | 1019980005800 A | 3/1998 |
| KR | 100244812 B1 | 2/2000 |
| KR | 100304687 B1 | 7/2001 |
| KR | 20030027817 A | 4/2003 |
| KR | 20030094099 A | 12/2003 |
| KR | 20040066938 A | 7/2004 |
| KR | 20060116192 A | 11/2006 |
| KR | 101051276 B1 | 7/2011 |
| KR | 20110084419 A | 7/2011 |
| KR | 101274822 B1 | 6/2013 |
| KR | 101308241 B1 | 9/2013 |
| KR | 20140068131 A | 6/2014 |
| KR | 101452083 B1 | 10/2014 |
| KR | 101464036 B1 | 11/2014 |
| KR | 20140132295 A | 11/2014 |
| KR | 20150037638 A | 4/2015 |
| KR | 20150037641 A | 4/2015 |
| KR | 20150142573 A | 12/2015 |
| KR | 20150142627 A | 12/2015 |
| KR | 20160058802 A | 5/2016 |
| KR | 101649842 B1 | 8/2016 |
| KR | 20170003658 A | 1/2017 |
| KR | 20170033830 A | 3/2017 |
| KR | 20170039564 A | 4/2017 |
| KR | 20170056457 A | 5/2017 |

* cited by examiner

METHOD OF ETCHING SUBSTRATE

PRIORITY STATEMENT

This U.S. non-provisional patent application claims priority under 35 U.S.C. § 119 to Korean Patent Application Nos. 10-2017-0131509 and 10-2018-0010176, filed on Oct. 11, 2017 and Jan. 26, 2018, respectively, in the Korean Intellectual Property Office, the entire contents of which are hereby incorporated by reference.

BACKGROUND

The inventive concept relates to a method of fabricating a semiconductor device, and in particular, to a photolithographic method of forming patterns of a semiconductor device.

In general, a semiconductor device is fabricated by a plurality of unit processes. The unit processes include a deposition process, a mask forming process, and an etching process. The deposition process and the etching process may be performed using plasma. The plasma is used to process a substrate at a high temperature. Generally, the plasma is generated by a radio frequency (RF) power. The mask forming process may include a process of forming a layer of photoresist on the substrate, an exposure process that exposes select portions of the layer of photoresist corresponding to patterns to be formed, and a developing process that removes select (exposed or unexposed) portions of the layer of photoresist, thereby forming a photoresist mask. The etching process is then carried out through the mask to transfer the pattern of the mask to the underlying layer(s) which may include that formed by the deposition process.

SUMMARY

According to the inventive concept, a pattern forming method of forming patterns in a substrate may include forming a photoresist pattern on the substrate, the photoresist pattern containing a first carbon compound, a reforming process of form an upper mask layer on a top surface of the photoresist pattern, the upper mask layer containing a second carbon compound different in kind from the first carbon compound, and etching a portion of the substrate using the upper mask layer and the photoresist pattern as an etch mask.

According to the inventive concept, there is also provided a pattern forming method including forming a hard mask layer comprising silicon oxynitride on a substrate, forming a photoresist pattern of material photo-sensitive to extreme ultraviolet (EUV) light on the hard mask layer, a reforming process of forming an upper mask layer a top surface of the photoresist pattern, and etching the hard mask layer and a portion of the substrate using the photoresist pattern and the upper mask layer as an etch mask. The reforming process includes supplying a nitrogen gas and a methane gas into a region over the substrate at a flow rate ratio of 10:1, applying an upper power to the region over the substrate to induce plasma and to deposit radicals in the plasma onto the upper mask layer, and applying a lower power to a region below the substrate to re-induce the plasma and to remove a portion of the upper mask layer using ions in the plasma.

Also, according to the inventive concept, a pattern forming method includes forming a photoresist pattern on a substrate, supplying a nitrogen gas and a methane gas into a region over the photoresist pattern at a first flow rate ratio, applying an upper power to the nitrogen gas and the methane gas to induce plasma and to deposit radicals in the plasma on the photoresist pattern, cutting off the upper power, supplying the nitrogen gas and the methane gas at a second flow rate ratio, in which a fraction of the nitrogen gas is higher than that in the first flow rate ratio, and applying a lower power to the nitrogen gas and the methane gas to re-induce the plasma and to remove a portion of the deposited radicals using ions in the plasma.

BRIEF DESCRIPTION OF THE DRAWINGS

The inventive concept will be more clearly understood from the following brief description taken in conjunction with the accompanying drawings. The accompanying drawings illustrate non-limiting examples of the inventive concept as described in detail hereinafter.

It should be noted that these figures are intended to illustrate the general characteristics of methods, structure and/or materials utilized in certain examples and to supplement the written description provided below. These drawings are not, however, to scale and may not precisely reflect the precise structural or performance characteristics of any given example, and should not be interpreted as defining or limiting the range of values or properties encompassed by the inventive concept. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
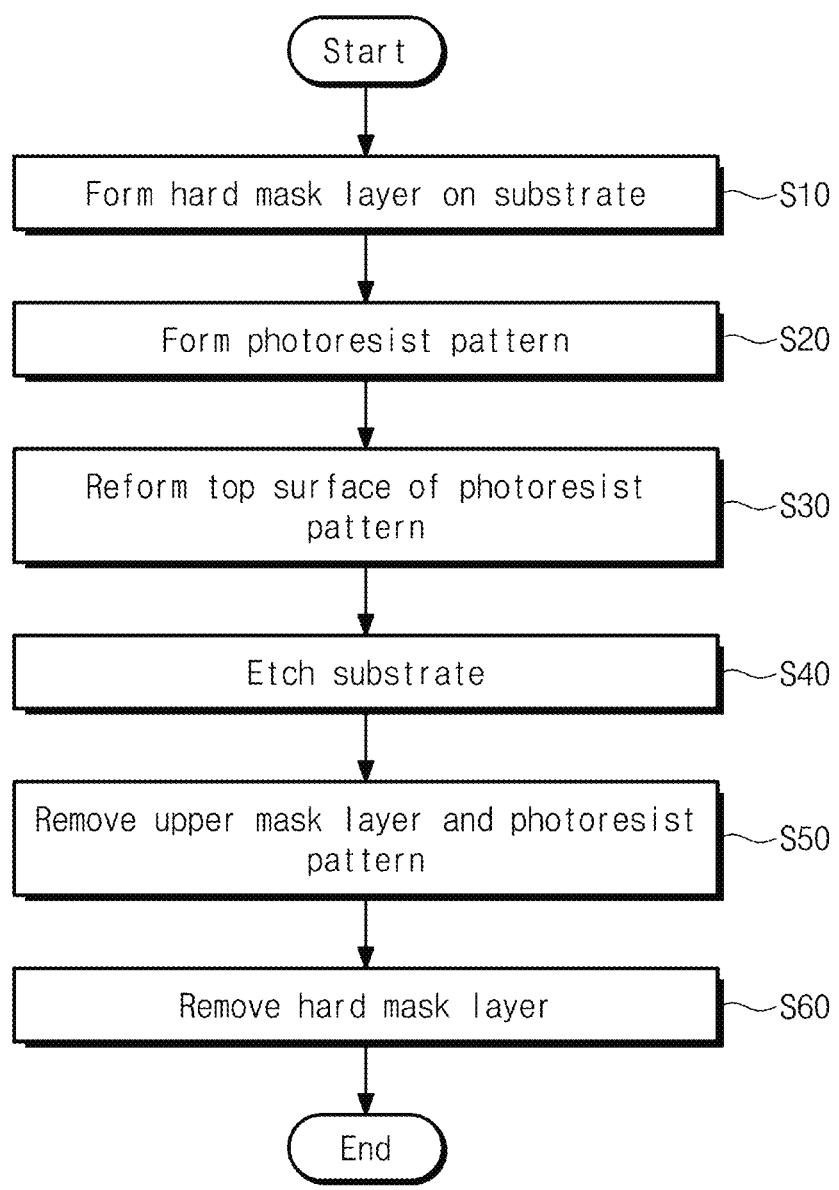
FIG. 1 is a flow chart illustrating a method of forming patterns of a semiconductor device according to the inventive concept.

FIG. 1 illustrates a method of forming patterns of a semiconductor device according to the inventive concept.

Referring to FIG. 1, the pattern forming method according to the inventive concept may include forming a hard mask layer on a substrate (S10), forming a photoresist pattern (S20), reforming a top surface of the photoresist pattern (S30), etching the substrate (S40), removing an upper mask layer and the photoresist pattern (S50), and removing the hard mask layer (S60).

FIGS. 2 to 7 are sectional views of a substrate illustrating the method of FIG. 1.

Figure 2:
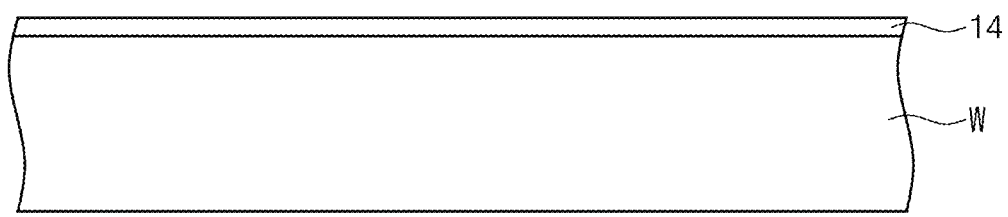
FIGS. 2, 3, 4, 5, 6 and 7 are sectional views of a substrate during the course of the method of FIG. 1.

Referring to FIGS. 1 and 2, a hard mask layer 14 may be formed on the substrate W (S10). For example, the substrate W may include or be a silicon wafer. In certain examples, the substrate W further includes at least one thin film on the silicon wafer layer, i.e., the substrate may be a semiconductor substrate including a base and one or more layers formed on the base. The hard mask layer 14 may include a silicon oxynitride (SiON) layer, which is formed by a plasma-enhanced chemical vapor deposition (PECVD) method.

Figure 3:
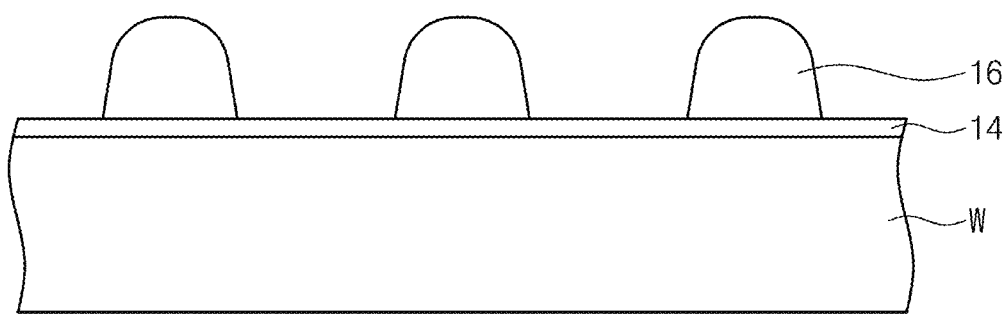

Referring to FIGS. 1 and 3, a photoresist pattern 16 may be formed on the hard mask layer 14 (S20). The photoresist pattern 16 may be formed by, for example, an extreme ultraviolet (EUV) photolithography method as opposed to an ArF or KrF photolithography method. First, a layer of photoresist that is photo-sensitive to EUV light is formed on the hard mask layer 14. Then select portions of the layer of photoresist are irradiated by EUV light generated by an EUV light source. Then the exposed layer of photoresist is developed.

Because the depth to which the EUV light can penetrates a photoresist layer is less than the depth to which ArF or KrF light can penetrate, the photoresist pattern 16 is formed thinner than an ArF-sensitive photoresist layer (which has a thickness of about 45 nm or more). For example, the photoresist pattern 16 may be formed of an EUV-sensitive photoresist material a thickness of about 17 nm. The photoresist pattern 16 may be formed of a polyacetal resin. The photoresist pattern 16 may be formed of or include first carbon compounds. In some examples, the photoresist pattern 16 includes a hydrocarbon compound ($C_xH_yR_z$), where R is a halogen, x and y are positive real numbers, and z is zero or a positive real number.

Figure 4:
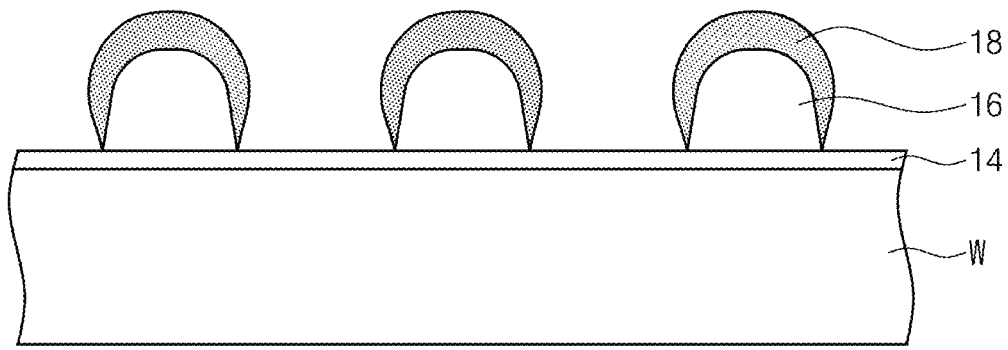
Figure 5:
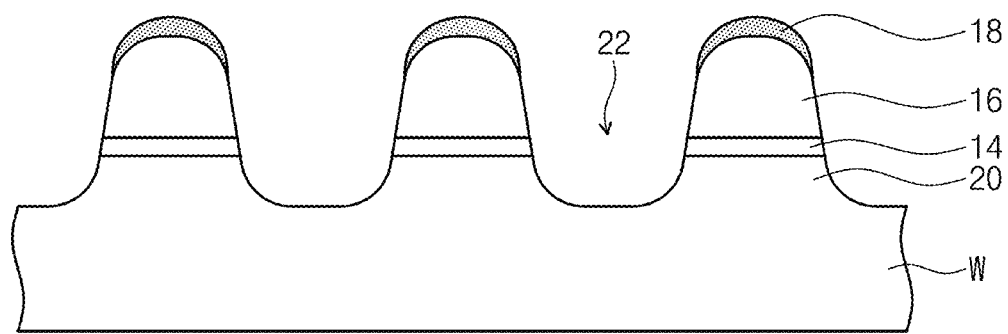
Figure 6:
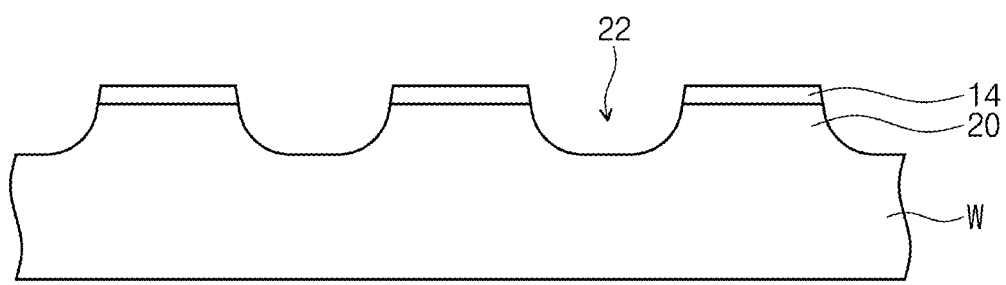

Referring to FIGS. 1 and 4, an upper mask layer 18 may be formed on a top surface of the photoresist pattern 16 by a reforming process which may be referred to as a process of reforming the top surface of the photoresist pattern (S30).

Figure 8:
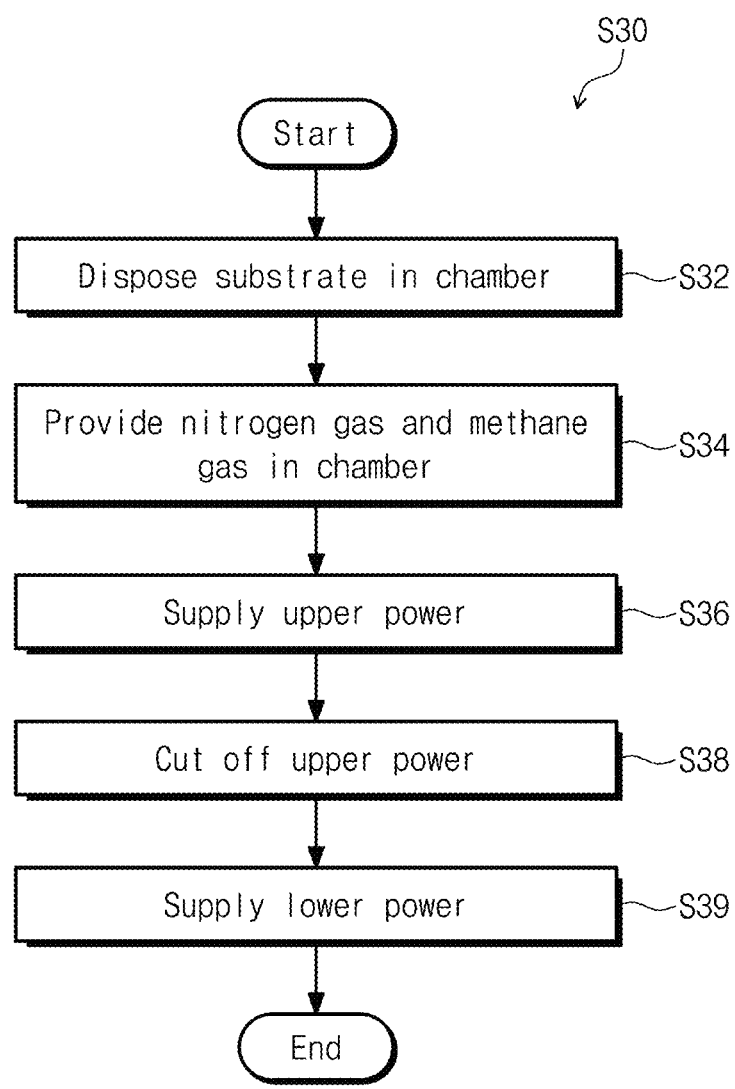
FIG. 8 is a flow chart exemplarily illustrating a reforming step of the method of FIG. 1.

FIG. 8 is a flow chart exemplarily illustrating the reforming step S30 of FIG. 1, which affects an upper portion of the photoresist pattern 16.

Referring to FIG. 8, the reforming process (S30) may include disposing a substrate W in a chamber (S32), providing a nitrogen ($N_2$) gas and a methane ($CH_4$) gas in the chamber (S34), supplying an upper power to the chamber (S36), cutting off the upper power (in S38), and supplying a lower power to the chamber (S39).

Figure 9:
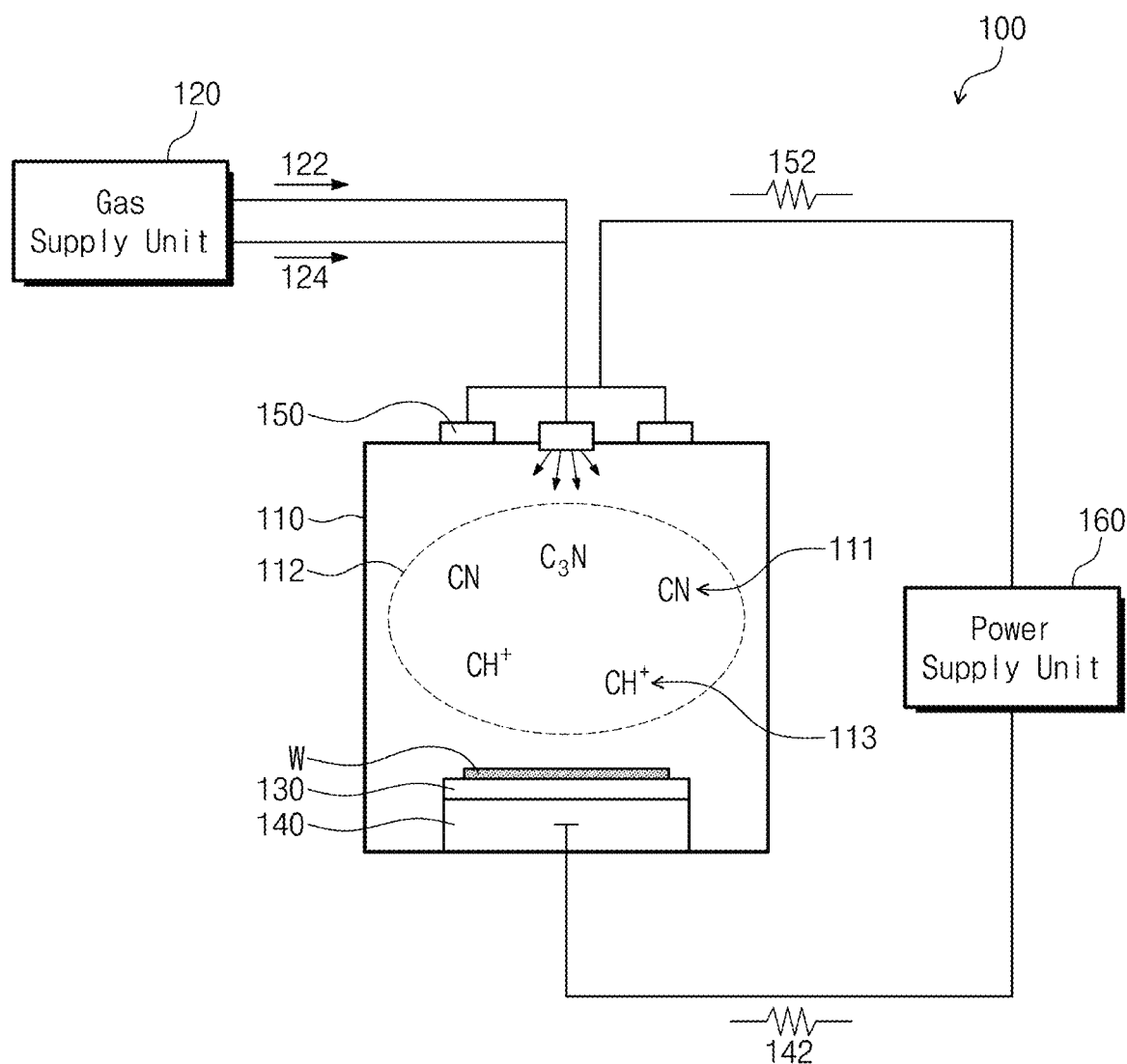
FIG. 9 is a schematic diagram illustrating an example of a plasma processing system, which may be used to form an upper mask layer in the stage of the method illustrated in FIG. 4.

FIG. 9 illustrates an example of a plasma treatment system 100, which may be used to form the upper mask layer 18 in the stage of the method shown in FIG. 4.

Referring to FIG. 9, the plasma treatment system 100 may be an inductively coupled plasma (ICP) system. Alternatively, the plasma treatment system 100 may be a capacitively coupled plasma (CCP) or micro power plasma etching system. The plasma treatment system 100 may include a chamber 110, a gas supply unit 120, an electrostatic chuck 130, a lower electrode 140, an antenna 150, and a power supply unit 160. The chamber 110 may be configured to provide an isolated space for the substrate W. The gas supply unit 120 may be adapted to supply a nitrogen gas 122 and a methane gas 124 into (an upper region of) the chamber 110. The electrostatic chuck 130 may be operative to fix the substrate W in place (in a lower region of the chamber 110) during processing. The lower electrode 140 may be provided below and/or in the electrostatic chuck 130. The antenna 150 may be provided on the chamber 110. The power supply unit 160 may be configured to supply a lower power 142 and an upper power 152 to the lower electrode 140 and the antenna 150, respectively.

Referring to FIGS. 8 and 9, the substrate W may be provided on the electrostatic chuck 130 in the chamber 110 using, for example, a robot arm (S32). Although not shown, the chamber 110 may include a lower housing and an upper housing. If the lower and upper housings are spaced apart from each other, the substrate W may be loaded on the electrostatic chuck 130 in the lower housing.

Next, the gas supply unit 120 may be configured to supply the nitrogen gas 122 and the methane gas 124 into the chamber 110 (S34). If the lower and upper housings are coupled to each other and the chamber 110 is pumped out (evacuated), the nitrogen gas 122 and the methane gas 124 may be induced into the chamber 110. The nitrogen gas 122 may consist of a first reaction gas and/or a dilution gas. The methane gas 124 may be a second reaction gas or an etching gas. For example, in the case in which the nitrogen gas 122 is supplied at a flow rate of about 10 SCCM to about 200 SCCM, the methane gas 124 may be supplied at a flow rate of about 1 SCCM to about 20 SCCM. In some examples, the nitrogen gas 122 and the methane gas 124 are provided at respective flow rates having a ratio of 10:1. For example, in the case in which the nitrogen gas 122 is supplied at a flow rate of about 100 SCCM, the methane gas 124 may be provided at a flow rate of about 10 SCCM.

Figure 10:
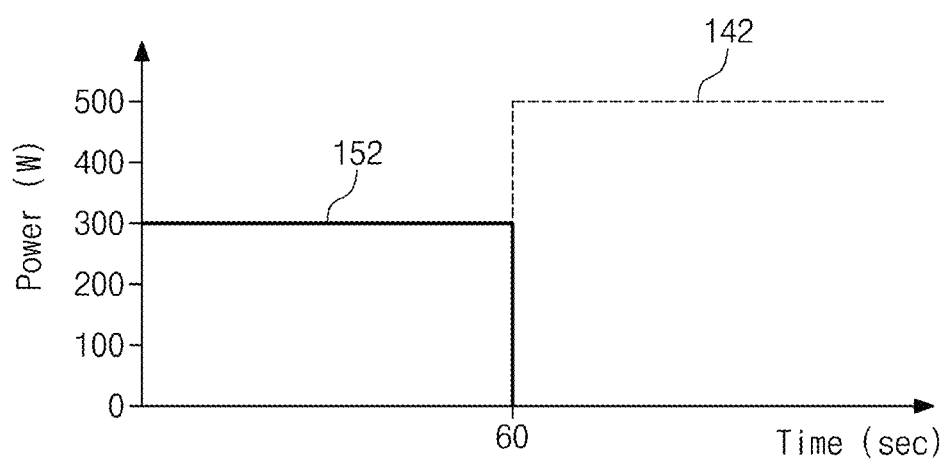
FIG. 10 is a graph illustrating a lower power and an upper power over time applied by the plasma processing system of FIG. 9 during a plasma process of etching a substrate W in the method of FIG. 1.

FIG. 10 illustrates the lower power 142 and the upper power 152 over time in the plasma processing system of FIG. 9 when carrying out the reforming step (S30).

Referring to FIGS. 8 to 10, the power supply unit 160 may be configured to supply the upper power 152 and the lower power 142 in a sequential and/or independent manner, when the upper portion of the photoresist pattern 16 is reformed.

Firstly, the upper power 152 may be supplied to the antenna 150 (S36). The upper power 152 may be used to induce (i.e., start) a plasma 112 in the chamber 10. In addition, the upper power 152 may be used to produce radicals 111 and ions 113, which constitute the plasma 112, from the nitrogen gas 122 and the methane gas 124. The radicals 111 may be deposited on the photoresist pattern 16. As a result of the deposition of the radicals 111, the upper mask layer 18 may be formed on the photoresist pattern 16. For example, the radicals 111 may include carbon-nitrogen radicals (e.g., CN or $C_3N$) or nitrogen-hydrogen radicals (e.g., NH). The ions 113 may include hydrocarbon ions ($CH^+$) or hydrogen ions ($H^+$). The ions 113 may be recombined in the plasma 112 in several seconds, thereby forming the methane gas 124 or the hydrogen gas, and then may be exhausted to the outside of the chamber 110. The upper power 152 may have a frequency of about 13.56 MHz. The upper power 152 may be about 300 W. The upper power 152 may be a source power.

Next, the power supply unit 160 may cut or turn off the upper power 152 (S38). The upper power 152 from the power supply unit 160 may be supplied to the antenna 150 for about 60-90 seconds.

The lower power 142 from the power supply unit 160 may be provided to the lower electrode 140 (S39). As soon as the supply of the upper power 152 to the antenna 150 is terminated, the lower power 142 may be provided to the lower electrode 140. The lower power 142 may be used to re-induce the plasma 112 and to concentrate the ions 113 in the plasma 112 onto the top surface of the substrate W. The ions 113 may be used to remove the radicals 111 on the photoresist pattern 16 or a portion of the upper mask layer 18. The lower power 142 may have the same frequency as that of the upper power 152. At least a portion of each of the lower and upper powers 142 and 152 may be provided in the form of a continuous wave. The lower power 142 may have a frequency of about 13.56 MHz, for example. By contrast, the lower power 142 may have a frequency ranging from about 10 MHz to about 1 MHz. The lower power 142 may have a voltage whose polarity is opposite to that of the voltage of the upper power 152. For example, in the case in which the upper power 152 has a positive voltage, the lower power 142 may have a negative voltage. The lower power 142 may be higher than the upper power 152. The lower power 142 may be about 500 W. The lower power 142 may be a bias power.

Figure 11A:
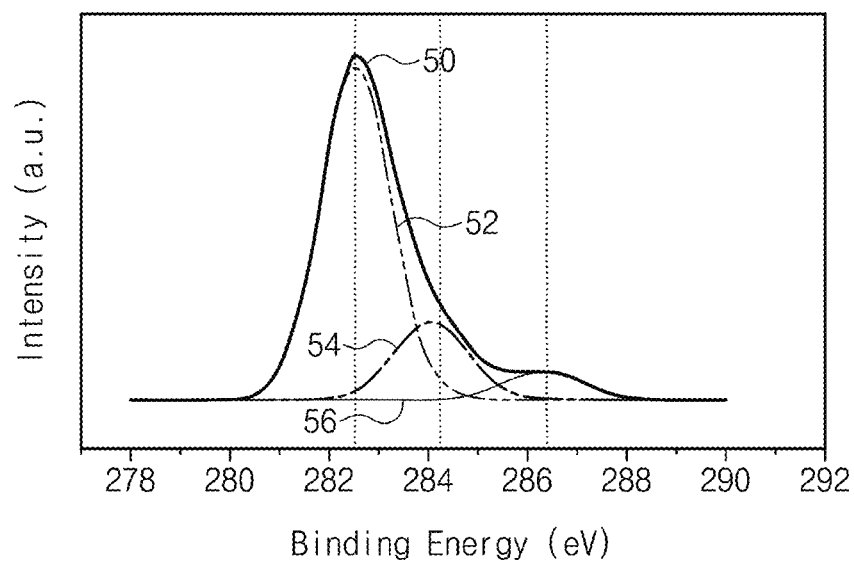
FIGS. 11A, 11B and 11C are XPS graphs of characteristics of first to third carbon compounds in a photoresist pattern or an upper mask layer.
Figure 11B:
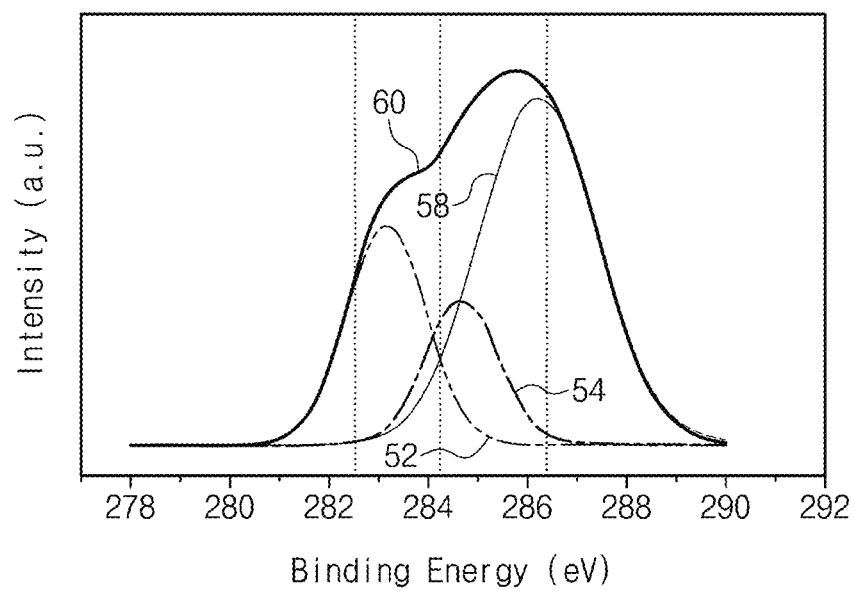
Figure 11C:
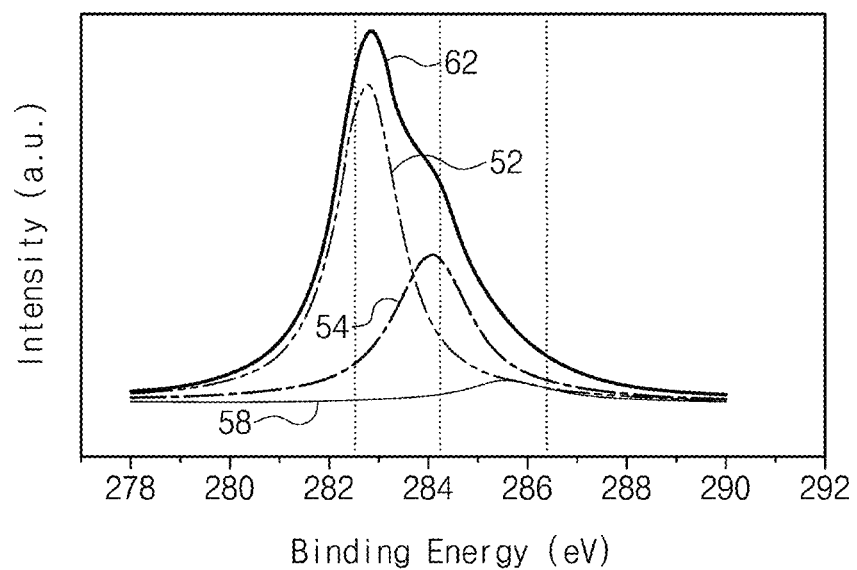
Figure 12A:
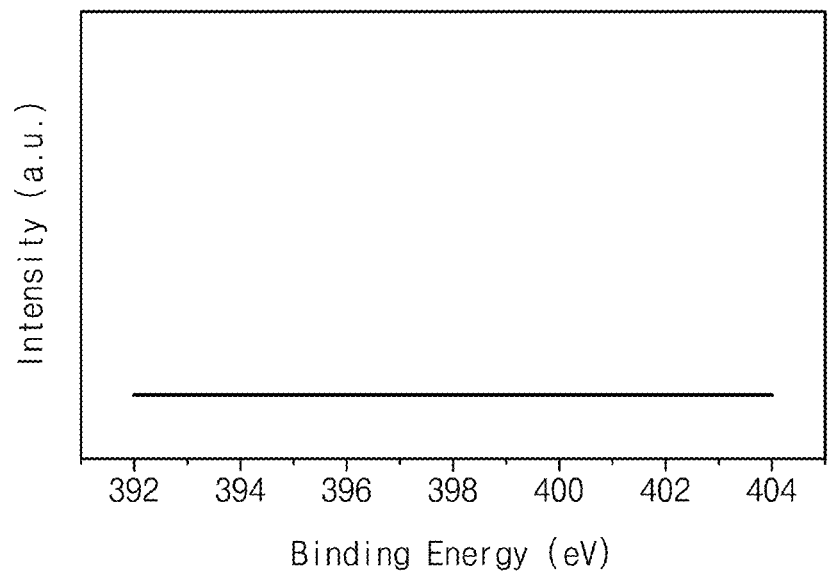
FIGS. 12A, 12B and 12C are XPS graphs of characteristics of first to first and second nitrogen compounds in a photoresist pattern or an upper mask layer.
Figure 12B:
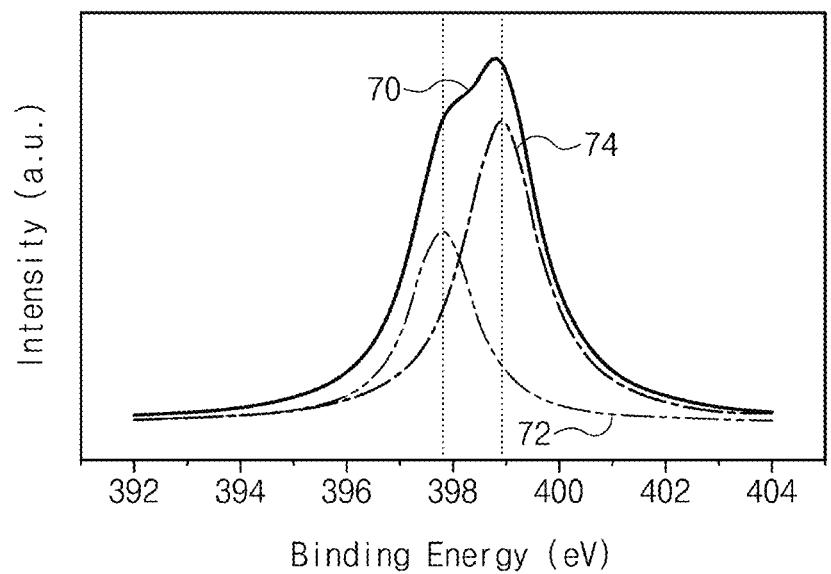
Figure 12C:
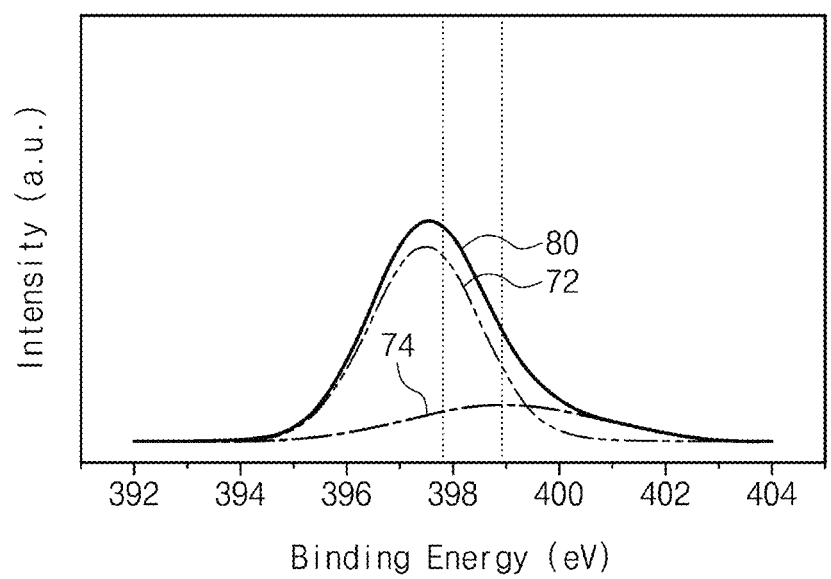

FIGS. 11A to 11C are XPS graphs of first to third carbon compounds 50, 60, and 62 in the photoresist pattern 16 or the upper mask layer 18. FIGS. 12A to 12C are XPS graphs of first and second nitrogen compounds 70 and 80 in the photoresist pattern 16 and the upper mask layer 18.

FIG. 11A shows results of an example of the method according to the inventive concept before the reforming process (S30) is performed. At this time, the photoresist pattern 16 contains first carbon compounds 50. The first carbon compounds 50 include a first carbon bonding structure 52, a second carbon bonding structure 54, and a carbon-oxygen (C—O) compound 56. The first carbon bonding structure 52 has a binding energy ranging from about 282.5 eV to about 283 eV. The first carbon bonding structure 52 has C—C sp2 bonds. The second carbon bonding structure 54 has a binding energy ranging from about 284 eV to about 284.5 eV. The second carbon bonding structure 54 has C—C sp3 bonds. The carbon-oxygen compound 56 has a binding energy ranging from about 286 eV to about 286.5 eV. The amount of each of the first and second carbon bonding structures 52 and 54 is more than the amount of the carbon-oxygen compound 56 in the first carbon compound 50 because the graph shows that the intensity of each of the first and second carbon bonding structures 52 and 54 is higher than the intensity of the carbon-oxygen compound 56.

At this time, too, as shown by FIG. 12A, the photoresist pattern 16 does not contain a nitrogen compound. In this example, the photoresist pattern 16 does not contain a carbon-nitrogen compound.

FIGS. 11B and 12B show results at the time of S30 in FIG. 8 when the radicals 111 are deposited using the upper power 152. At this time, the photoresist pattern 16 and the upper mask layer 18 include the second carbon compound 60 and the first nitrogen compound 70.

Referring to FIG. 11B, the second carbon compound 60 is different from the first carbon compound 50 represented by the graph of FIG. 11A. In this example, the second carbon compound 60 contains the first and second carbon bonding structures 52 and 54 and a first carbon-nitrogen (C—N) compound 58. The first carbon-nitrogen compound 58 has a binding energy similar to that of the carbon-oxygen compound 56. The first carbon-nitrogen compound 58 has a binding energy of about 286 eV. The binding energy intensity or amount of the first carbon-nitrogen compound 58 in the second carbon compounds 60 may be higher or greater than those of the first and second carbon bonding structures 52 and 54. The first carbon-nitrogen compound 58 contains the carbon-oxygen compound 56 (refer to FIG. 11A). However, the carbon-oxygen compound 56 in the upper mask layer 18 is removed by the plasma 112. For example, the carbon-oxygen compound 56 is converted into a gaseous material by the plasma 112, and such a gaseous material may be exhausted to the outside of the chamber.

FIG. 12B shows the upper mask layer 18 as containing the first nitrogen compound 70. In this example, the first nitrogen compound 70 includes a second carbon-nitrogen compound 72 and a nitrogen hydrogen (N—H) compound 74. The second carbon-nitrogen compound 72 has a binding energy of about 397.5 eV. The second carbon-nitrogen compound 72 may contain cyanoethynyl radicals (e.g., $C_3N$) or polyaniline. The nitrogen-hydrogen compound 74 has a binding energy of about 399 eV. The nitrogen-hydrogen compound 74 comprises ammonia ($NH_3$). A binding energy intensity or amount of the nitrogen-hydrogen compound 74 in the first nitrogen compound 70 is higher or greater than that of the second nitrogen compound 80.

FIGS. 11C and 12C show results of this example when the lower power 142 is supplied to remove the upper mask layer 18 and a portion of the photoresist pattern 16 using the ions 113. At this time, the upper mask layer 18 and the photoresist pattern 16 contain the third carbon compound 62 and the second nitrogen compound 80.

Referring to FIG. 11C, the third carbon compound 62 is different from the first and second carbon compounds 50 and 60 (refer back to FIGS. 11A and 11B). The third carbon compound 62 contains the first and second carbon bonding structures 52 and 54 and the first carbon-nitrogen compound 58. In this example, the amount of the first carbon-nitrogen compound 58 in the third carbon compound 62 is less than that of the first carbon-nitrogen compound 58 in the second carbon compound 60. In addition, the amount of the first carbon-nitrogen compound 58 in the third carbon compound 62 is less than that of the carbon-oxygen compound 56 in the first carbon compound 50. The first carbon-nitrogen compound 58 may constituent of the mask layer 18. Thus, the difference in amounts of the first carbon-nitrogen compounds 58 in the second and third carbon compounds 60 and 62 indicates that the upper mask layer 18 mainly consists of the first carbon-nitrogen compound 58.

As shown in FIG. 12C, the second nitrogen compound 80 is different from the first nitrogen compound 70 (refer back to FIG. 12B). The amount of the second carbon-nitrogen compound 72 is greater than the amount of the nitrogen-hydrogen compound 74 in the second nitrogen compound 80 because the intensity of the second carbon nitrogen compound 72 is higher than the intensity of the nitrogen-hydrogen compound 74. In the upper mask layer 18, most of the nitrogen-hydrogen compound 74 may exist in the form of a gaseous material (e.g., ammonia ($NH_3$)), and thus, may be easily removed by the plasma 112. The second carbon-nitrogen compound 72 remains in the upper mask layer 18. Thus, when the substrate W is etched, the first and second carbon-nitrogen compounds 58 and 72 may compose the upper mask layer 18, but the nitrogen-hydrogen compound 74 is not present in the upper mask layer 18.

Figure 13:
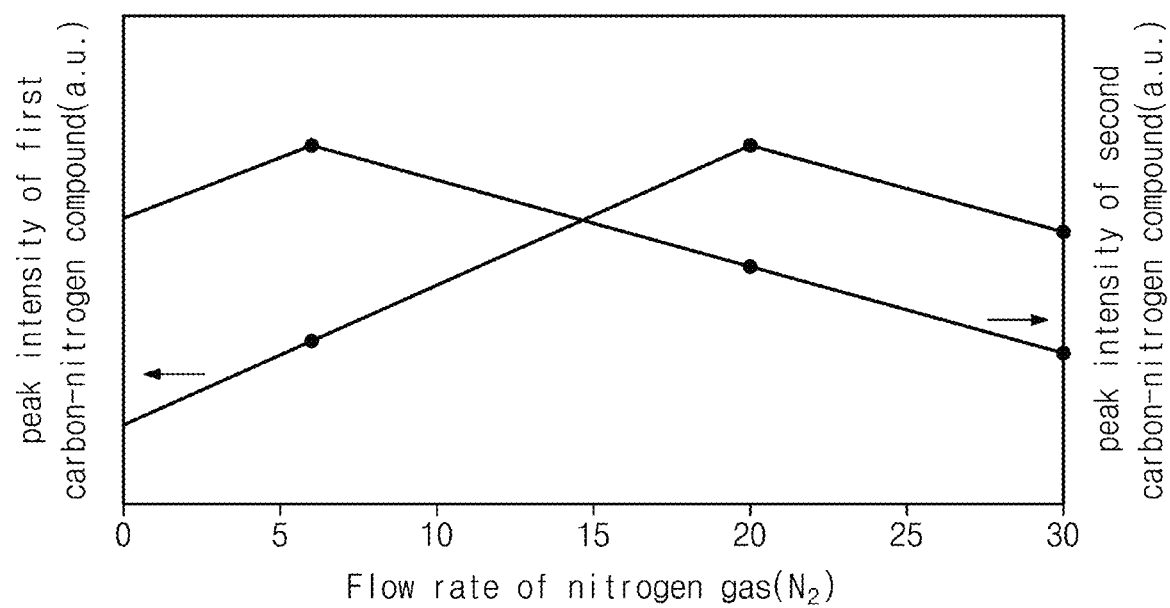
FIG. 13 is a graph showing peak intensities of binding energies of first and second carbon-nitrogen compounds according to a flow rate of a nitrogen gas in the system of FIG. 9.

FIG. 13 is a graph showing peak intensities of binding energies of the first and second carbon-nitrogen compounds 58 and 72 according to a flow rate of the nitrogen gas 122 in the plasma processing system of FIG. 9.

Referring to FIG. 13, when the nitrogen gas 122 is supplied into the chamber 110 at a flow rate of about 6 SCCM to 20 SCCM, large amounts of the first and second carbon-nitrogen compounds 58 and 72 are formed in the upper mask layer 18. The methane gas 124 was supplied into the chamber 110 at a flow rate of about 10 SCCM. When the nitrogen gas 122 and the methane gas 124 are supplied at a flow rate ratio of about 0.6:1, the amount of the second carbon-nitrogen compound 72 in the upper mask layer 18 can be maximized. When the nitrogen gas 122 and the methane gas 124 are supplied at a flow rate ratio of about 1:2, the amount of the first carbon-nitrogen compound 58 in the upper mask layer 18 can be maximized. Thus, if the nitrogen gas 122 and the methane gas 124 are supplied at a flow rate ratio ranging from about 0.6:1 to about 1:2 (in S34) and the upper power 152 is provided (S36), the amounts of the first and second carbon-nitrogen compounds 58 and 72 to be formed in the upper mask layer 18 may be maximized.

Subsequently, when the upper power 152 is cut off (S38) and the lower power 142 is applied to the lower electrode 140 (S39), the nitrogen gas 122 and the methane gas 124 may be provided in a ratio of about 10:1 into the chamber 110.

Referring back to FIGS. 1 and 5, the hard mask layer 14 and the substrate W may be etched using the upper mask layer 18 and the photoresist pattern 16 as an etch mask (S40). The step S40 of etching the substrate W may be performed in the same manner as the step S39 in which the lower power 142 is provided. In other words, the nitrogen gas 122 and the methane gas 124 may be provided at a flow rate ratio of about 10:1 into the chamber 110, and the lower power 142 may be about 500 W. An etch rate of the substrate W may range from about 20 nm/min to about 70 nm/min. In the case in which the amount of the methane gas 124 supplied into the chamber 110 is greater than that of the nitrogen gas 122, it may be difficult to adjust or control the etch rate of the substrate W. The hard mask layer 14 and the substrate W exposed by the photoresist pattern 16 may be etched to a depth ranging from about 50 nm to about 500 nm. The substrate W may have device patterns 20 and trenches 22 between the device patterns 20. The device patterns 20 may constitute an active region or a wiring region. The trenches 22 may be used to provide an insulating region between the device patterns 20.

Figure 14A:
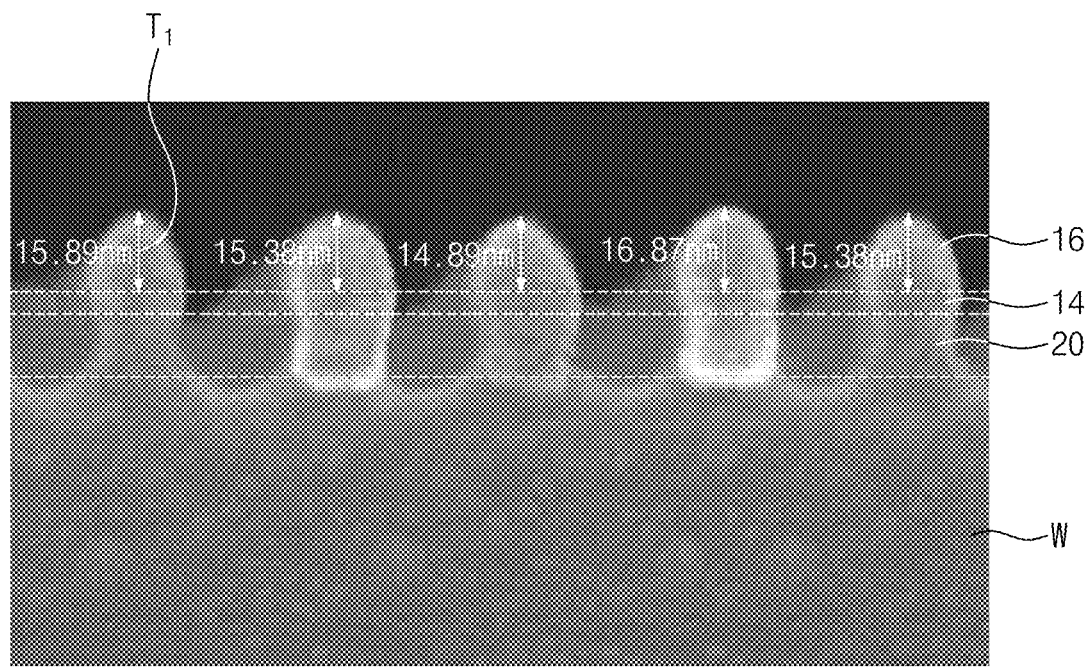
FIG. 14A is an image showing a section of a photoresist pattern (e.g., of FIG. 5) and its remaining thickness.
Figure 14B:
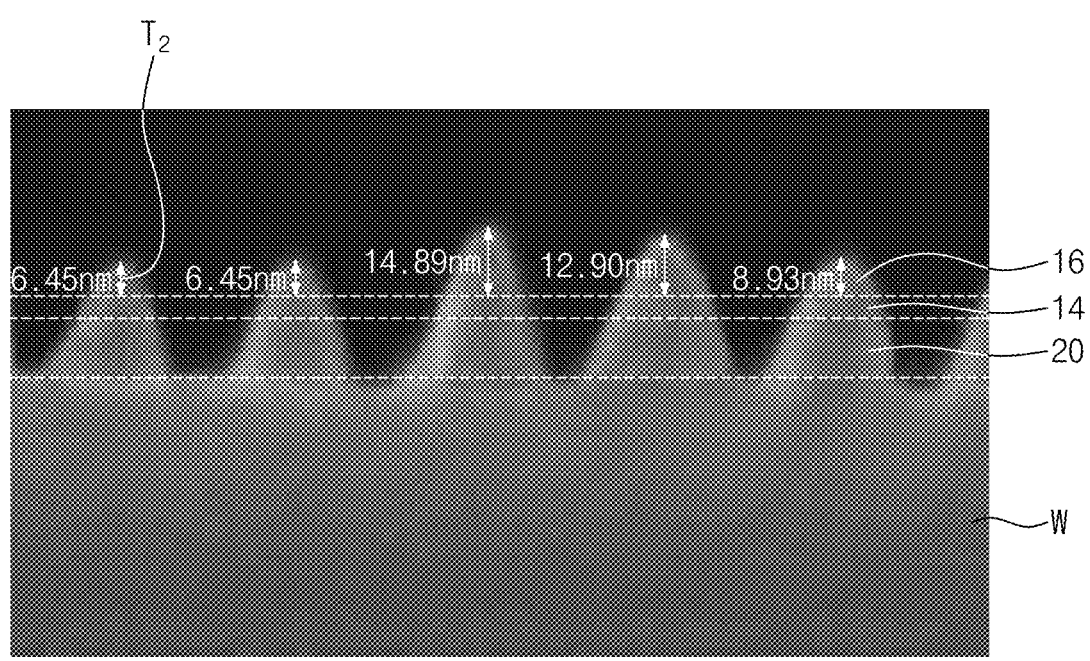
FIG. 14B is an image showing a section of a conventional photoresist pattern and its remaining thickness.
Figure 15:
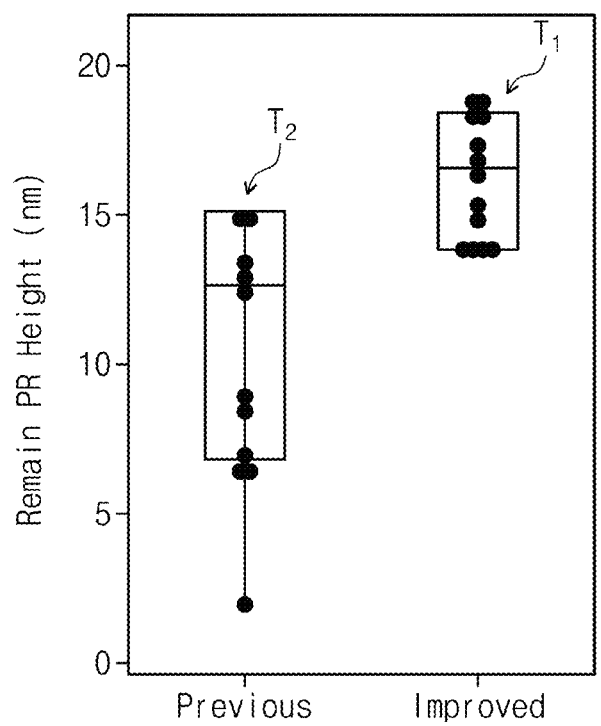
FIG. 15 is a graph showing a difference between a remaining thickness of a photoresist pattern according to some examples of the inventive concept and a remaining thickness of a conventional photoresist pattern.

FIG. 14A is an image showing the photoresist pattern 16 (e.g., of FIG. 5) having a remaining thickness $T_1$. FIG. 14B is an image showing a conventional photoresist pattern 119 having a remaining thickness $T_2$. FIG. 15 is a graph showing a difference between the remaining thickness $T_1$ of the photoresist pattern 16 and the remaining thickness $T_2$ of the conventional photoresist pattern 119. Here, each of the photoresist pattern 16 and the conventional photoresist pattern 119 had a thickness of about 17 nm before an etching process, and the substrate W was etched at an etch rate of about 56 nm/min.

Referring to FIGS. 14A, 14B, and 15, after an etching process, the remaining thickness $T_1$ of the photoresist pattern 16 was larger than the remaining thickness $T_2$ of the conventional photoresist pattern 119.

Referring to FIGS. 14A and 15, according to examples of the inventive concept, the photoresist pattern 16 had the remaining thickness T1 ranging from about 14 nm to about 17 nm. For example, the photoresist pattern 16 had the remaining thickness T1 of 14.89 nm, 15.38 nm, 15.88 nm, or 16.87 nm.

Referring to FIGS. 14B and 15, the conventional photoresist pattern 119 had the remaining thickness $T_2$ ranging from about 6 nm to about 15 nm. For example, when both of the upper power 152 and the lower power 142 were provided, the conventional photoresist pattern 119 (formed without the reforming of the upper portion thereof) had a remaining thickness $T_2$ of 6.45 nm, 8.93 nm, 12.90 nm, or 14.89 nm.

Referring back to FIGS. 1 and 6, the upper mask layer 18 and the photoresist pattern 16 may be removed (S50). The upper mask layer 18 and the photoresist pattern 16 may be removed by an ashing process or using an organic solvent.

Figure 7:
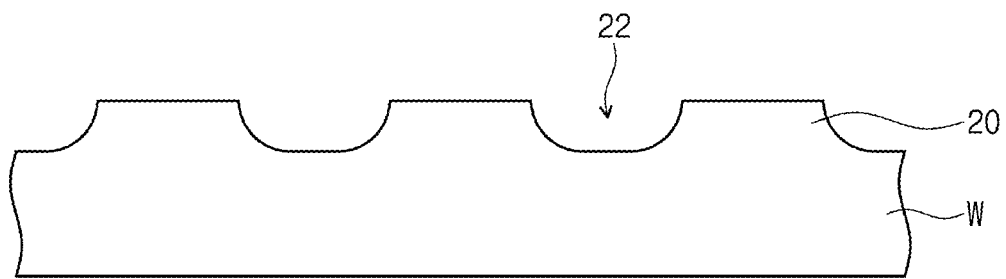

Referring to FIGS. 1 and 7, the hard mask layer 14 may be removed (S60). The hard mask layer 14 may be removed by a wet etching process. The device patterns 20 may be exposed to the outside.

According to an aspect of the inventive concept, a pattern forming method may include a step of reforming the top of a photoresist pattern. This makes it possible to maintain a desired thickness of the photoresist pattern in preparation for the etching of a substrate.

Although examples of the inventive concepts have been particularly shown and described, it will be understood by one of ordinary skill in the art that variations in form and detail may be made thereto without departing from the spirit and scope of the inventive concept as set forth in the attached claims.

What is claimed is:

1. A pattern forming method, comprising:
   forming a photoresist pattern on a substrate, the photoresist pattern containing a first carbon compound;
   a reforming process of forming an upper mask layer on a top surface of the photoresist pattern, the upper mask layer containing a second carbon compound different in kind from the first carbon compound; and
   etching a portion of the substrate using the upper mask layer and the photoresist pattern as an etch mask,
   wherein the second carbon compound comprises a carbon-nitrogen compound.

2. The method of claim 1, wherein the first carbon compound comprises a polyacetal resin.

3. The method of claim 1, wherein the second carbon compound comprises cyanoethynyl ($C_3N$).

4. The method of claim 1, wherein the reforming process comprises:
   providing the substrate in a chamber;
   introducing a nitrogen gas and a methane gas into an upper portion of the chamber over the substrate; and
   providing an upper power to the upper portion of the chamber, into which the nitrogen gas and the methane gas are introduced, to induce plasma in the chamber and to deposit radicals in the plasma on the photoresist pattern.

5. The method of claim 4, wherein, when the upper power is provided, the nitrogen gas and the methane gas are provided at a flow rate ratio ranging from 0.6:1 to 1:2.

6. The method of claim 4, wherein the substrate is provided in a lower portion of the chamber below the upper portion, and the reforming process further comprises:
   cutting off the upper power; and
   providing a lower power to the lower portion of the chamber to re-induce the plasma and to remove a portion of the radicals using ions in the plasma.

7. The method of claim 6, wherein, when the lower power is provided, the nitrogen gas and the methane gas are introduced into the upper portion of the chamber at a flow rate ratio of 10:1.

8. The method of claim 6, wherein each of the upper power and the lower power is applied in the form of a continuous wave, and frequencies of the continuous waves of the upper and lower powers are equal to each other.

9. The method of claim 1, further comprising forming a hard mask layer on the substrate before the photoresist pattern is formed so that the hard mask layer is interposed between the substrate and the photoresist pattern, wherein the hard mask layer comprises silicon oxynitride.

10. A pattern forming method, comprising:

forming a hard mask layer comprising silicon oxynitride, on a substrate;

forming a photoresist pattern that is photo-sensitive to extreme ultraviolet (EUV) light on the hard mask layer;

a reforming process of forming an upper mask layer on a top surface of the photoresist pattern; and etching the hard mask layer and a portion of the substrate using the photoresist pattern and the upper mask layer as an etch mask, wherein the reforming process comprises:

supplying a nitrogen gas and a methane gas into a region over the substrate at a flow rate ratio of 10:1;

applying an upper power to the region over the substrate to induce plasma and to deposit radicals in the plasma onto the upper mask layer; and applying a lower power to a region below the substrate to re-induce the plasma and to remove a portion of the upper mask layer using ions in the plasma.

11. The method of claim 10, wherein the reforming process further comprises cutting off the upper power, before the applying of the lower power.

12. The method of claim 10, wherein the lower power is higher than the upper power.

13. The method of claim 12, wherein the upper power is applied at a positive voltage, and the lower power is applied at a negative voltage.

14. The method of claim 10, wherein each of the upper power and the lower power is applied in the form of a continuous wave.

15. A method of etching a substrate, comprising:

forming a photoresist pattern on a substrate;

supplying a nitrogen gas and a methane gas into a region over the photoresist pattern at a first flow rate ratio;

applying an upper power to the nitrogen gas and the methane gas to induce plasma and to deposit radicals in the plasma on the photoresist pattern;

cutting off the upper power;

supplying the nitrogen gas and the methane gas at a second flow rate ratio, in which a fraction of the nitrogen gas is higher than that in the first flow rate ratio; and applying a lower power to the nitrogen gas and the methane gas to re-induce the plasma and to remove a portion of the deposited radicals using ions in the plasma.

16. The method of claim 15, wherein the first flow rate ratio of the nitrogen gas to the methane gas ranges from 0.6:1 to 1:2.

17. The method of claim 15, wherein the second flow rate ratio of the nitrogen gas to the methane gas is 10:1.

18. The method of claim 15, wherein the radicals contain a carbon-hydrogen compound.

19. The method of claim 15, wherein the radicals contain cyanoethynyl ($C_3N$).

* * * * *